(12) United States Patent
Kurihara

(10) Patent No.: US 6,469,942 B1
(45) Date of Patent: Oct. 22, 2002

(54) SYSTEM FOR WORD LINE BOOSTING

(75) Inventor: Kazuhiro Kurihara, Sunnyvale, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/920,248

(22) Filed: Jul. 31, 2001

(51) Int. Cl.[7] .......................... G11C 7/00; G11C 16/04
(52) U.S. Cl. .......................... 365/189.09; 365/185.18; 365/185.11
(58) Field of Search ....................... 365/185.18, 189.09, 365/189.11, 230.06

(56) References Cited

U.S. PATENT DOCUMENTS

| | | | |
|---|---|---|---|
| 6,104,665 A | * | 8/2000 | Hung et al. ............. 365/230.06 |
| 6,134,146 A | * | 10/2000 | Bill et al. .............. 365/185.23 |
| 6,255,900 B1 | * | 7/2001 | Chang et al. ............... 327/589 |

* cited by examiner

*Primary Examiner*—Son Mai
(74) *Attorney, Agent, or Firm*—Coudert Brothers LLP

(57) ABSTRACT

System for boosting a signal for use in a memory device. The system includes a circuit for providing a boosted signal used to produce a word line signal in a memory device. The circuit includes a pre-charge stage that has an output terminal and is coupled to receive an address signal and a boost control signal. The pre-charge stage is operable to produce the boosted signal having a pre-charged level at the output terminal. The circuit also includes a boost stage that is coupled to receive the boost control signal and produce a boost activation signal at a boost stage output terminal that is coupled to the output terminal via a capacitive element. When the boost activation signal is active, the boosted signal is set to a selected boost level that is independent of supply voltage.

9 Claims, 4 Drawing Sheets

SYSTEM FOR WORD LINE BOOSTING

FIELD OF THE INVENTION

The present invention relates generally to boost circuits for use in low-power memory devices, and more particularly, to a word line boost circuit that is independent of supply voltage.

BACKGROUND OF THE INVENTION

For low voltage operation of a memory device, for example a "Flash" memory device, word line-voltage-boosting is used to boost the voltage levels of word line signals used to operate the memory.

FIG. 1 shows a diagram of a typical boost circuit used in a memory device. The boost circuit 100 receives a supply voltage (Vcc) and a boost control signal 102 to produce a boosted signal (VPXG) for use by the memory device. For example, the VPXG signal is a global programming pulse that is input to sector select circuits 104. The sector select circuits 104 receive sector control signals 106 that activate a selected sector select circuit to produce a sector programming pulse 108 derived from the VPXG signal. The sector programming pulses 108 are received by Xdecoder circuits 110 that output boosted word line signals 112 in response to received decode signals 114. The boosted word line signals are based on the sector pulses 108.

However, typical boosting circuits, such as the boost circuit 100, produce VPXG signals that are dependent on the supply voltage (Vcc). As a result, the boosted VPXG signal may have voltage variations that cause the derived word line signals to fail meeting high and low voltage margins required to operate the memory device.

FIG. 2 shows a graph illustrating a dependence relationship between core cell current (I) and a voltage derived from the core cell current in a conventional boost circuit. For example, a boosted word line voltage results in a core cell current that is converted to a voltage. The indicator at Iref indicates a current level used as a reference to compare to a core cell current to determine a data value in a memory device. The indicator $I_1$ indicates a desired current level to be read from the core cell to determine a data value of 1, and the indicator $I_0$ indicates a desired current level to be read from the core cell to determine a data value of 0.

If the word line voltage is dependent on supply voltage, the core cell current created by the varying word line voltage may degrade current margins such that it becomes difficult to read the core cell data value. For example, if the word line voltage is too low or too high, the current margin to read a data value of 1 or 0 will become smaller. Thus, if the boosted word line has a power supply dependence, power supply variation may result in degraded memory operation.

Therefore is would be desirable to have a booster circuit that operates independently from supply voltage to produce boosted signals in a memory device.

SUMMARY OF THE INVENTION

The present invention includes a system-that provides for word line boosting that is independent of supply voltage. The system includes a pre-charge stage to pre-charge a capacitive boost element, and a boost stage to produce the boosted memory signal. Thus, the boosted memory signal is boosted independently of the supply voltage (Vcc).

In one embodiment of the invention, a circuit for providing a boosted signal used to produce a word line signal in a memory device is provided. The circuit includes a precharge stage that has an output terminal and is coupled to receive an address signal and a boost control signal. The pre-charge stage operable to produce the boosted signal having a pre-charged level at the output terminal. The circuit also includes a capacitive element that has a first and a second terminal. The first terminal of the capacitive element is coupled to the output terminal. A boost stage is included that is coupled to receive the boost control signal and produce a boost activation signal at a boost stage output terminal that is coupled to the second terminal of the capacitive element. When the boost activation signal is active, the boosted signal is set to a selected boost level that is independent of supply voltage.

In another embodiment of the invention, a method for providing a boosted signal used to produce a word line signal in a memory device is provided. The method includes steps of receiving an address signal, pre-charging the boosted signal to a pre-charge level, receiving a boost control signal, and boosting the boosted signal from the pre-charge level to a boosted level that is independent from a supply voltage.

BRIEF DESCRIPTION OF THE DRAWINGS

The forgoing aspects and the attendant advantages of this invention will become more readily apparent by reference to the following detailed description when taken in conjunction with the accompanying drawings wherein.

DETAILED DESCRIPTION OF THE INVENTION

The present invention includes a system that provides for word line boosting that is independent of supply voltage.

Figure 1:
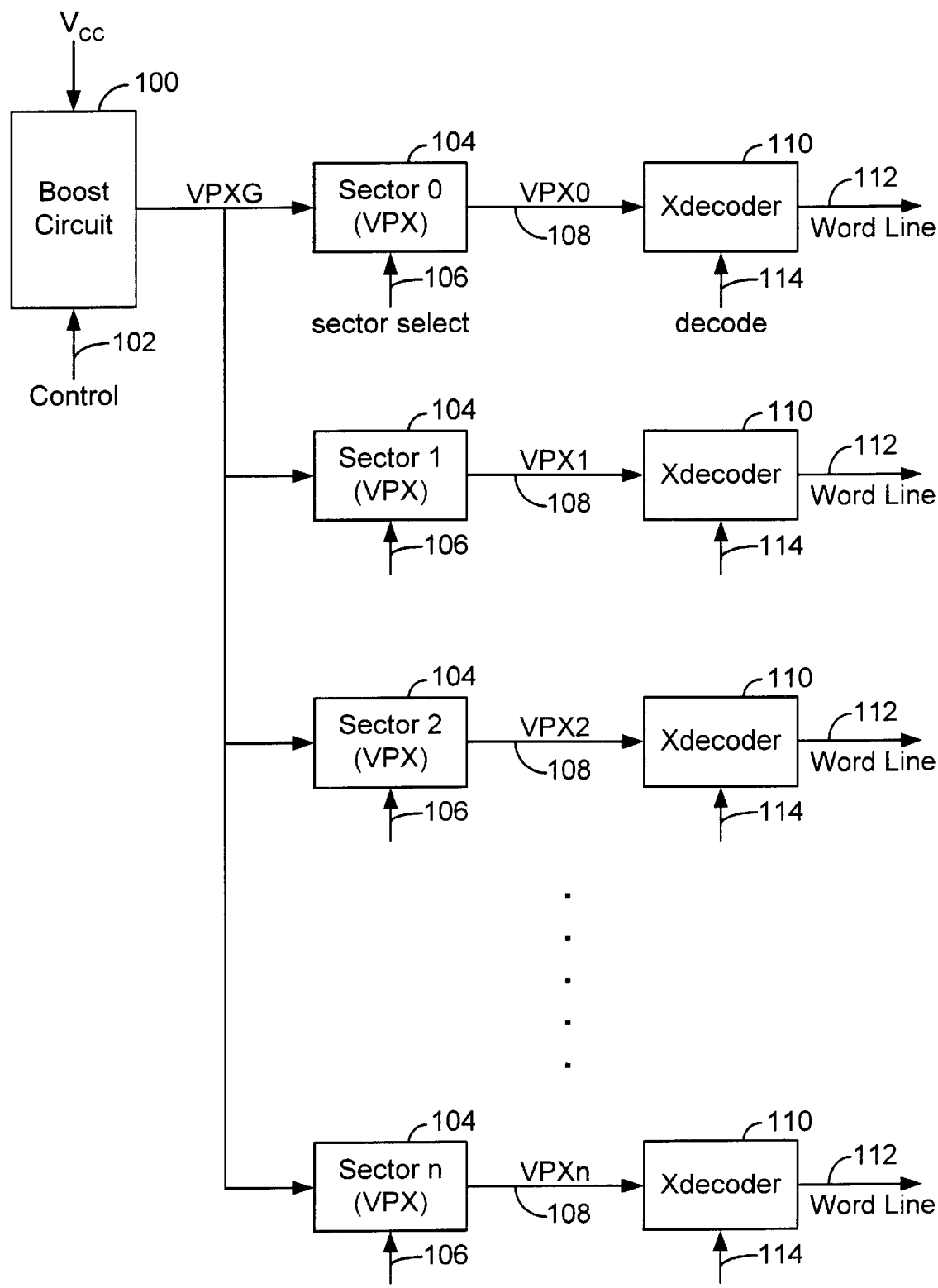
FIG. 1 shows a conventional boost circuit used to provide boosted word line signals in a memory device.
Figure 2:
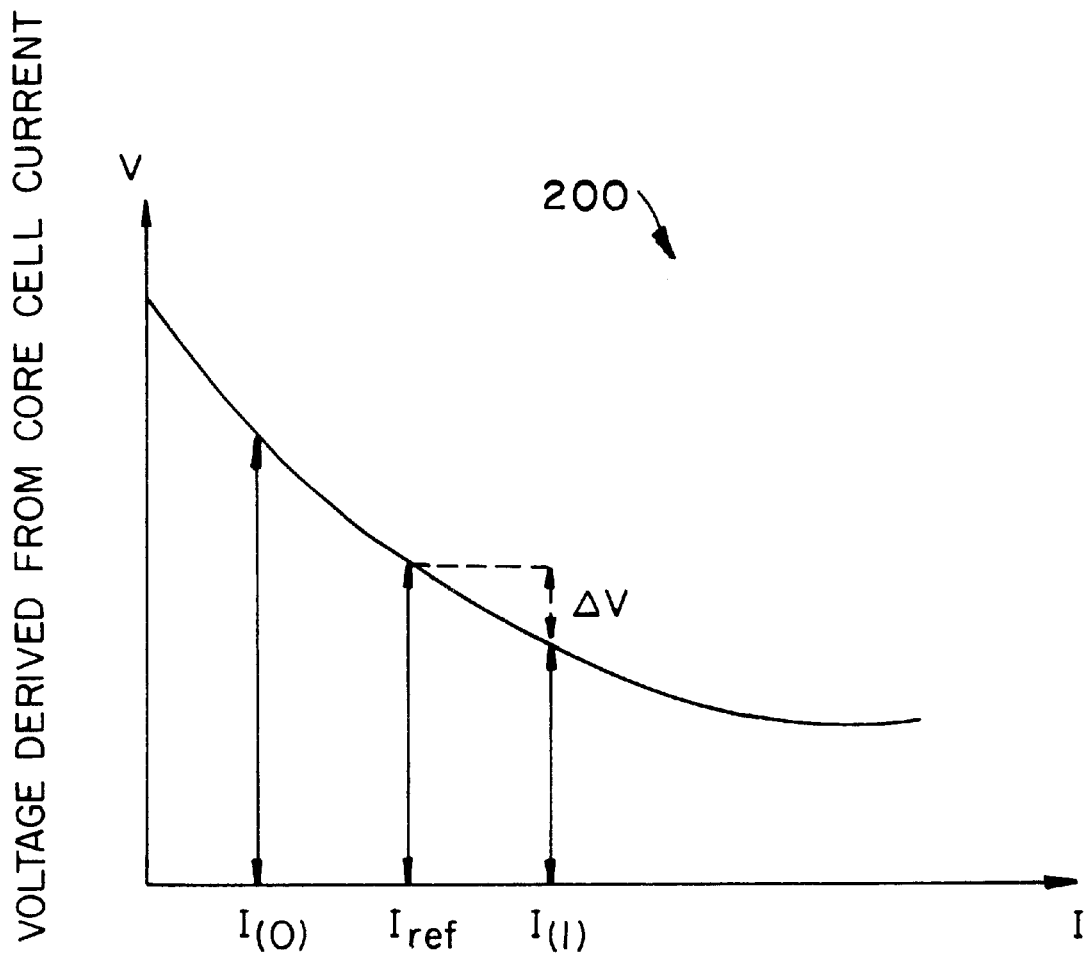
FIG. 2 shows a graph illustrating the relationship between current (I) and supply voltage (Vcc) in a conventional boost circuit.
Figure 3:
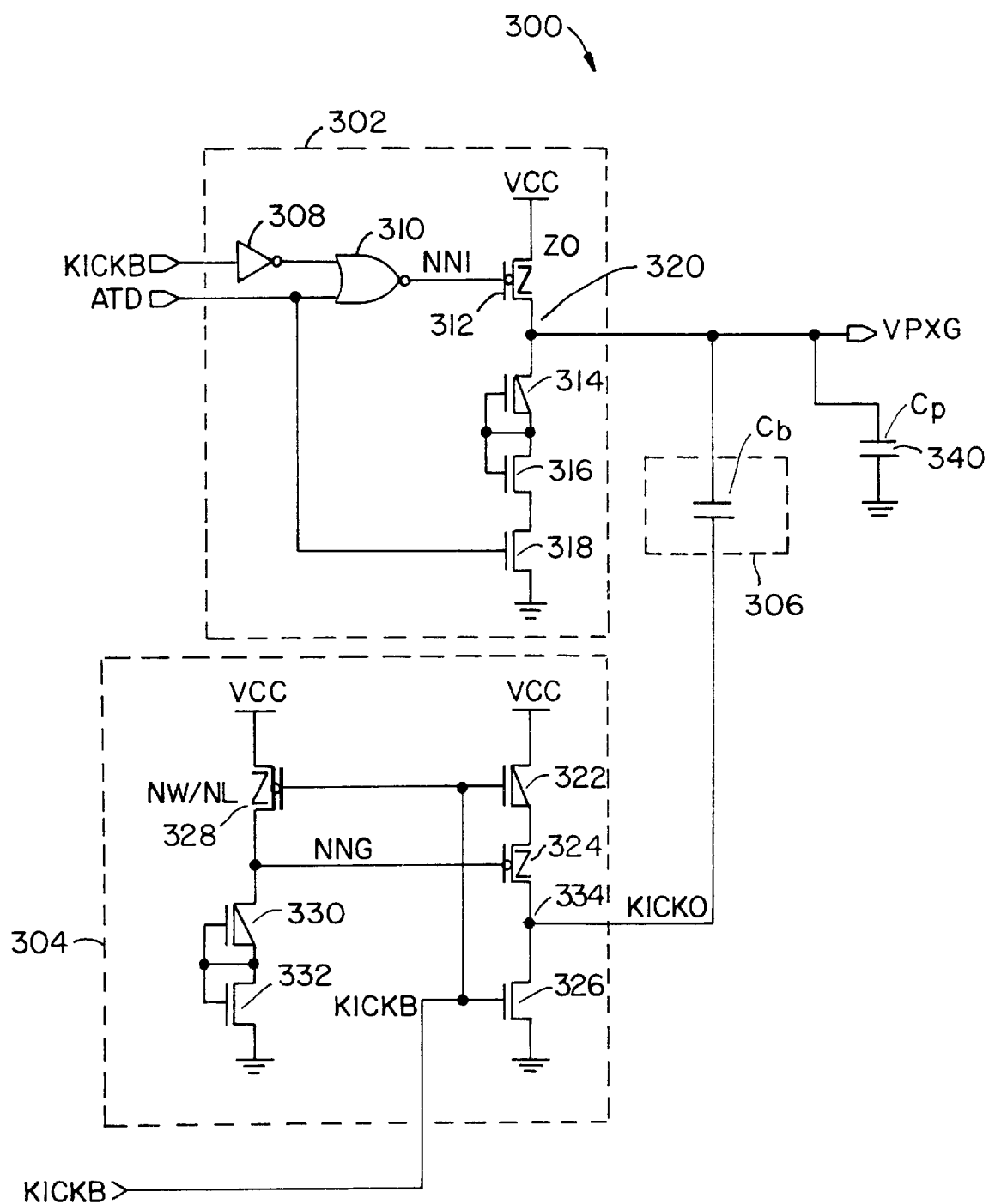
FIG. 3 shows a booster circuit constructed in accordance with the present invention that independent of the supply voltage.

FIG. 3 shows a booster circuit 300 that is independent of the supply voltage in accordance with the present invention. The circuit 300 includes a pre-charge stage 302, a boost stage 304 and a capacitive element 306. The capacitive element has a capacitance value of Cb.

The pre-charge stage 302 includes an inverter 308 and a NOR gate 310 that receive boost control signals. The boost control signals are a KICKB signal and an ATD signal. The KICKB signal indicates that the boost circuit is to be activated. The ATD signals is related to addressing the memory device and indicates when a new word line is to be activated.

The pre-charge stage also includes transistors 312, 314, 316, 318. These transistors are coupled together and between a power supply terminal (Vcc) and a ground terminal. The transistors 312 and 314 are coupled together at node 320 that forms the global boosted output signal (VPXG).

The boost stage 304 includes transistors 322, 324, 326 that are coupled together and between Vcc and ground terminals. The boost stage 304 also includes transistors 328, 330, 332 that are couple together and between Vcc and ground terminals. The transistors 328, 322, 326 receive the KICKB signal at their gate terminals. The transistors 324 and 326 are coupled together at node 334 that forms an output signal (KICK0) that is coupled to the VPXG signal via the capacitive element 306. It is also assumed that the VPXG signal will be coupled to other memory logic, and as a result, a parasitic capacitance 340 having a capacitance value of Cp will exist.

During operation of the circuit 300, when the ATD signal is at a high level, the output signal VPXG is pre-charged without dependency on Vcc to an initial voltage that can be expressed as:

$$VPXG=|Vtp1|+Vtn1 \quad (1)$$

where Vtp1 is the threshold voltage of transistor 314 and Vtn1 is the threshold voltage of transistor 316. When the KICKEB signal goes from a high level to a low level, the VPXG signal is boosted. The resulting KICK0 signal can be expressed as:

$$KICK0=|Vtp3|+Vtn4-Vtz5 \quad (2)$$

where Vtp3 is the voltage threshold of transistor 330, Vtn4 is the voltage threshold of transistor 332, and Vtz5 is the voltage threshold of transistor 324. The result VPXG signals can be expressed as:

$$VPXG=|Vtp1|+Vtn1+Delta \quad (3)$$

where Delta can be expressed as:

$$Delta=[Cb/(Cb+Cp)]* [|Vtp3|+Vtn4-Vtz5] \quad (4)$$

Because the KICK0 signal does not have Vcc dependency, the Delta signal will not have Vcc dependency. Since the node NN1 is at Vss during boosting, the transistor 312 is turned off.

Figure 4:
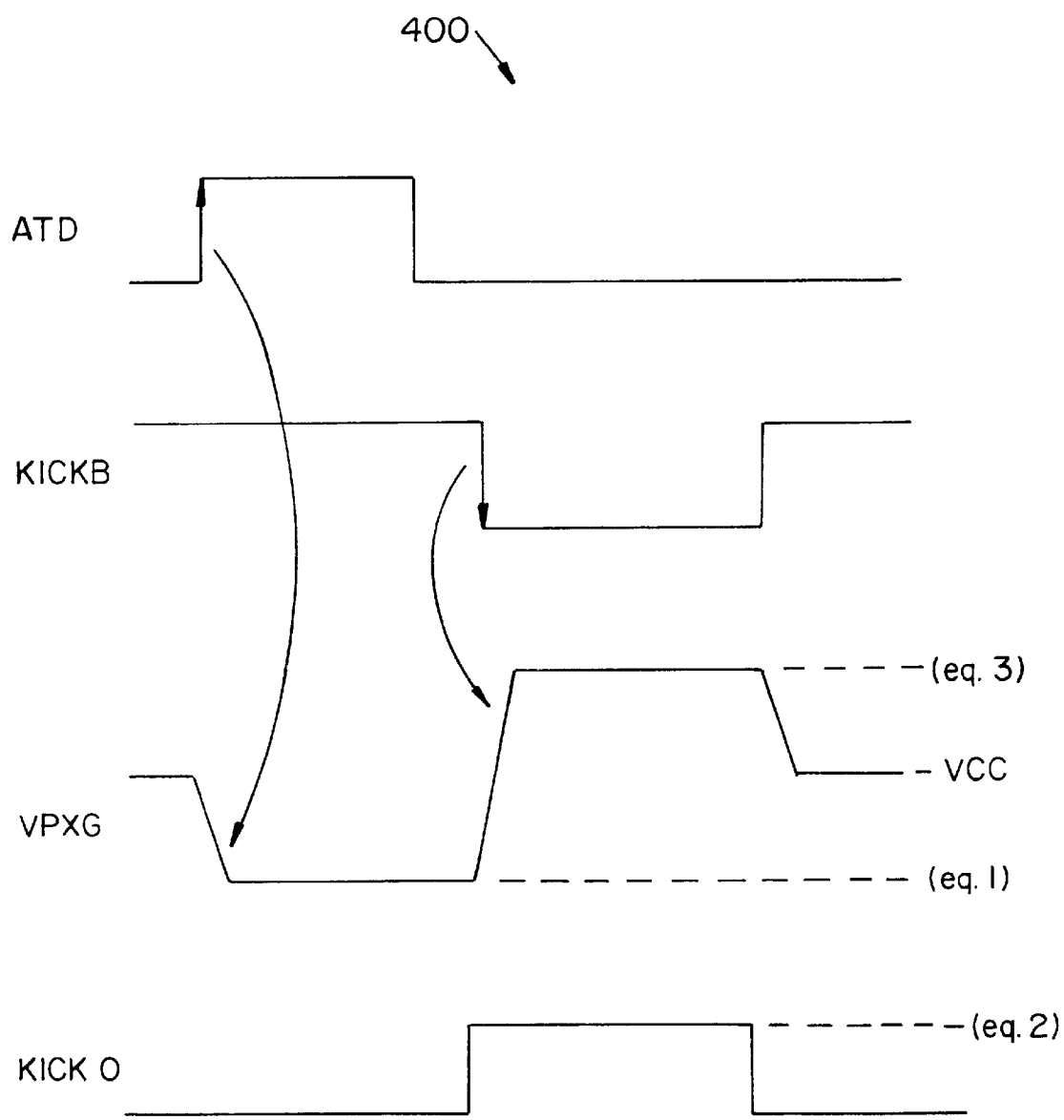
FIG. 4 shows a timing diagram illustrating signal timing of signals associated with the booster circuit of FIG. 3.

FIG. 4 shows a timing diagram 400 illustrating signal timing of signals associated with the booster circuit of FIG. 3. The timing diagram 400 shows that when the ATD signal goes to a high level, the VPXG signal is pre-charged to a level described by equation (1). When the KICKB signal goes to a low level, the timing diagram shows that the VPXG signal goes to the boosted level described by equation (3). The boosted level is not dependent on Vcc. During the time that the KICKB signal is at a low level, the KICK0 signal is at a level described by equation 2.

The present invention includes a system that provides for word line boosting that is independent of supply voltage. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention which. is set forth in the following claims.

What is claimed is:

1. A circuit for providing a boosted signal used to produce a word line signal in a memory device, the circuit comprising:

a pre-charge stage-having an output terminal and coupled to receive an address signal and a boost control signal, the pre-charge stage operable to produce the boosted signal having a pre-charged level at the output terminal;

a capacitive element having a first and a second terminal, the first terminal of the capacitive element coupled to the output terminal; and a boost stage coupled to receive the boost control signal and produce a boost activation signal at a boost stage output terminal that is coupled to the second terminal of the capacitive element, wherein when the boost activation signal is active, the boosted signal is set to a selected boost level that is independent of supply voltage.

2. The circuit of claim 1, wherein the pre-charge stage further comprises:

a NOR gate having two NOR inputs and a NOR Output, the NOR inputs coupled to receive the address signal and the boost control signal; and first and second transistors having a common node that forms the output terminal, wherein the first transistor is coupled to the NOR output.

3. The circuit of claim 2, wherein the boost stage further comprises:

first, second and third boost transistors coupled to receive the boost control signal at their respective gate terminals; and a fourth boost transistor coupled to the first boost transistor at the boost stage output terminal.

4. The circuit of claim 1, wherein the capacitive element is a capacitor.

5. The circuit of claim 4, wherein the pre-charge stage further comprises:

a NOR gate having two NOR inputs and a NOR output, the NOR inputs coupled to receive the address signal and the boost control signal; and first and second transistors having a common node that forms the output terminal, wherein the first transistor is coupled to the NOR output.

6. The circuit of claim 1, wherein the boost stage further comprises:

first, second and third boost transistors coupled to receive the boost control signal at their respective gate terminals; and a fourth boost transistor coupled to the first boost transistor at the boost stage output terminal.

7. The circuit of claim 6, wherein the capacitive element is a capacitor.

8. A method for providing a boosted signal used to produce a word line signal in a memory device, the method comprising steps of:

receiving an address signal;

pre-charging the boosted signal to a pre-charge level;

receiving a boost control signal; and boosting the boosted signal from the pre-charge level to a boosted level that is independent from a supply voltage.

9. The method of claim 8, wherein the step of boosting comprises steps of:

generating a boost activation signal from the boost control signal, wherein the boost activation signal is independent from the power supply; and coupling, via a capacitive element, the boost activation signal to the boosted signal.

* * * * *